(12) United States Patent
Loraine et al.

(10) Patent No.: US 7,295,075 B2
(45) Date of Patent: Nov. 13, 2007

(54) OFDM AMPLIFIER AND METHOD THEREFOR

(75) Inventors: Jeremy Loraine, Cottenham (GB); Jeffery Wojtiuk, Willingham (GB); Philip Macphail, Cherry Hinton (GB); Stephen J. Kovacic, Ottawa (CA)

(73) Assignee: SiGe Semiconductor Inc., Ottawa, Ontario (CA)

( * ) Notice: Subject to any disclaimer, the term of this patent is extended or adjusted under 35 U.S.C. 154(b) by 112 days.

(21) Appl. No.: 11/272,795

(22) Filed: Nov. 15, 2005

(65) Prior Publication Data
US 2006/0205378 A1 Sep. 14, 2006

Related U.S. Application Data

(60) Provisional application No. 60/522,871, filed on Nov. 16, 2004.

(51) Int. Cl.
H03F 3/04 (2006.01)

(52) U.S. Cl. ........................... 330/297; 330/285

(58) Field of Classification Search ................ 330/136, 330/297, 285; 455/293, 333
See application file for complete search history.

(56) References Cited

U.S. PATENT DOCUMENTS 6,888,409 B1 * 5/2005 Taylor ..................... 330/297
2004/0196093 A1 * 10/2004 Le et al. .................. 327/536

* cited by examiner

Primary Examiner—Robert Pascal
Assistant Examiner—Hieu Nguyen
(74) Attorney, Agent, or Firm—Townsend and Townsend and Crew, LLP

(57) ABSTRACT

Within an amplifier circuit having an amplifying transistor, a boost voltage is presented at a port of the transistor. The amplifying transistor has a base, an emitter and a collector or a gate, a source, and a drain. A capacitor is provided in electrical communication with the transistor. A voltage source is provided for providing one of the collector and the source with a first voltage and for in a first mode of operation charging the first capacitor. Also within the circuit is a switch for switching between the first mode of operation and a second other mode of operation wherein the first capacitor and the voltage source cooperate to provide a voltage at one of the collector and the source in excess of the first voltage.

21 Claims, 7 Drawing Sheets

OFDM AMPLIFIER AND METHOD THEREFOR

FIELD OF THE INVENTION

The invention relates to amplifiers and more particularly to power amplifiers.

BACKGROUND OF THE DISCLOSURE

Frequency division multiplexing (FDM) is a technology for transmitting different data sets within each of multiple signals simultaneously over a single transmission path, such as a cable or wireless system. Each signal travels within a carrier—a unique frequency range that is modulated by data being transmitted.

Orthogonal frequency division multiplexing (OFDM) is a spread spectrum technique that distributes each data set of the different data sets over a large number of carriers that are spaced apart at predetermined frequencies. This spacing provides the "orthogonality" in this technique, which allows for demodulators that are responsive only to frequencies relating to a signal data set. The benefits of OFDM are high spectral efficiency, resiliency to RF interference, and lower multi-path distortion. OFDM is advantageous because in a typical terrestrial broadcasting scenario there are multipath-channels—transmitted signals arrive at a receiver using various paths of different length. Since multiple versions of a signal interfere one with another it becomes difficult to extract data being transmitted.

For amplifying an OFDM signal, an amplifier must support a range of pulse amplitudes from a first level of amplitude through a peak amplitude. Though support for peak amplitude is a requirement of OFDM standards, OFDM peak pulses come with such infrequency that designing an amplifier to support them, though required, increases the power consumption of the PA and adds a level of complexity and cost that is undesirable.

For example, it is known to improve power consumption of PA's by varying supply voltage with a DC to DC converter to be proportional to the amplitude of the transmitted signal. Lower collector voltages are used to achieve lower output powers and higher collector voltages are used to achieve higher voltage values. Assuming high efficiencies in the regulator, very low power consumption is realized at low RF output powers. Unfortunately, this approach requires relatively large regulator components capable of delivering >700 mA with a very clean output spectrum. In general, the size and conversion efficiency of this regulator type is more problematic at high current due to the dropping losses in the pass transistors. Ultimately, The approach suffers from cost and size issues.

The regulator approach is Prior Art and is an effective way of increasing the PA efficiency, by varying the collector or drain voltage on the amplifying transistor and changing the load line of the PA. Linearity requirements, however, force the gain/phase response to be linear with voltage change, or that pre-distortion is applied.

Other variants on this theme attempt to use a very fast, envelope tracking power supply on the collector in combination with a variable base supply. The modulation amplitude is realized by varying the power supply voltage while the phase information is injected onto the RF signal. Envelope tracking requires an even more complex power supply than the DC to DC converter approach and has yet to demonstrated in a practical fashion.

It would be advantageous to provide a method and apparatus to improve the power output, efficiency, and distortion of an OFDM power amplifier without significantly increasing the power supply complexity, or needing a second voltage supply. Advantageously, improving these attributes is beneficial in WLAN systems in order to provide users with better data transmission range, longer intervals between battery charging, and more generally lower power consumption.

SUMMARY OF THE INVENTION

In accordance with the invention there is provided an amplifier comprising: an amplifying transistor having one of a base, an emitter and a collector and a gate, a source, and a drain; a first capacitor; a voltage source for providing one of the collector and the source with a first voltage and for in a first mode of operation charging the first capacitor; and, a switch for switching between the first mode of operation and a second other mode of operation wherein the first capacitor and the voltage source cooperate to provide a voltage at one of the collector and the source in excess of the first voltage.

In accordance with another aspect of the invention there is provided a storage medium having stored therein data, the data for when executed resulting in an amplifier design comprising: an amplifying transistor having a first port, a second port and a third port; a first capacitor; a voltage source for providing the third port with a first voltage and for in a first mode of operation charging the first capacitor; and, a switch for switching between the first mode of operation and a second other mode of operation wherein the first capacitor and the voltage source cooperate to provide a voltage at the third port in excess of the first voltage.

In accordance with yet another aspect of the invention there is provided a method of amplifying an OFDM RF signal comprising: providing a first voltage source; providing a second voltage source; providing an OFDM RF signal including peak pulses; providing an indication of a presence of a peak pulse; and during a duration of the indicated peak pulse, boosting the voltage on the amplifier by summing a voltage of the first voltage source and a voltage of the second voltage source and applying said sum thereto.

BRIEF DESCRIPTION OF THE DRAWINGS

Exemplary embodiments of the invention will now be described in conjunction with the following drawings, in which.

DETAILED DESCRIPTION OF AN EMBODIMENT OF THE INVENTION

Figure 1:
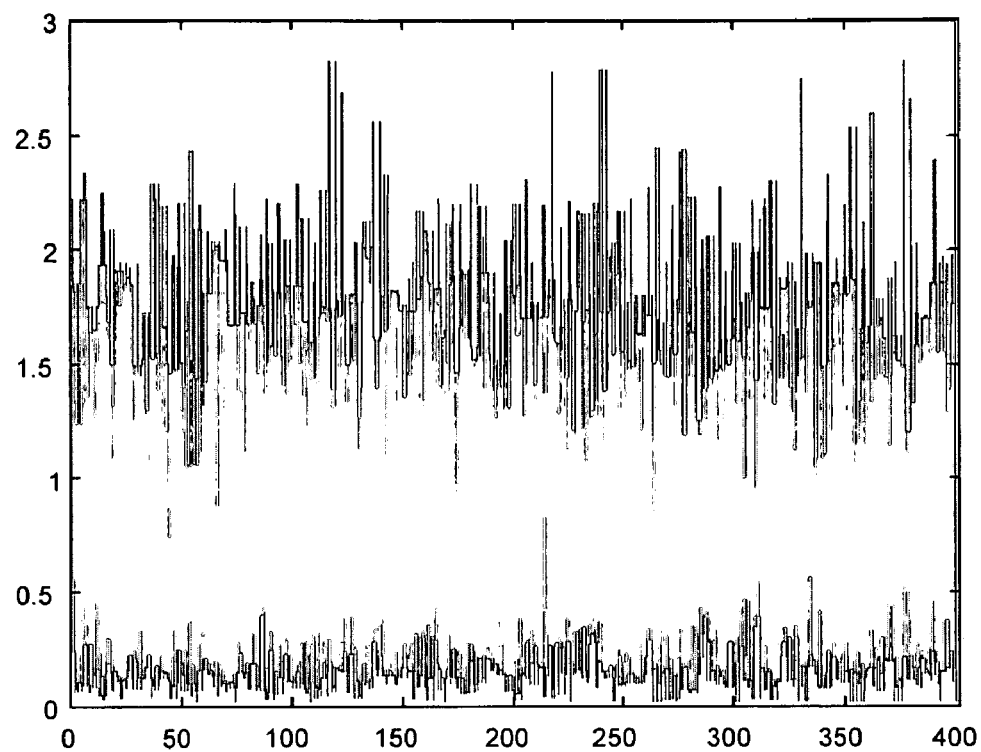
FIG. 1 illustrates a graph of linear RF output voltage versus time for 100 OFDM symbols.

Referring to FIG. 1, a graph of linear RF output voltage versus time for 100 OFDM symbols is shown. The graph represents the magnitude of the RF envelope. In an ideal system, power used in the power amplifier (PA) would be at any instant proportional to the square of the RF voltage required. For example, by controlling current within the power amplifier (PA) to be proportional to the RF signal amplitude, power consumption is controlled. Unfortunately, this has a limited range of control, as a reasonable amount of current is required to maintain a linear gain in the PA. Further, transistors within the PA act to limit the current as it rises as if the current density is too high resulting in a decreasing RF gain for peak pulses. So there is a finite amount of improvement by 'dynamically' biasing the current in the transistors—or class B operation.

Current generation portable battery operated devices rely on advances in battery technology and on advances in low power circuit operation in order to enhance battery life, reduce circuit costs, and improve reliability. Unfortunately, using current control to render power consumption more efficient has the above noted drawbacks. As such, to support all of the OFDM symbols is difficult to do in an efficient manner using current control. Therefore, it is extremely difficult to amplify an OFDM signal in a low cost battery powered integrated device while maintaining portability and long battery life.

Since peak pulses are statistically infrequent, operation of a PA in an inefficient mode for the sole purpose of supporting peak pulses is not ideal. Furthermore, failing to support peak pulses, and therefore failing to support proper OFDM operation, is also not ideal.

Figure 2:
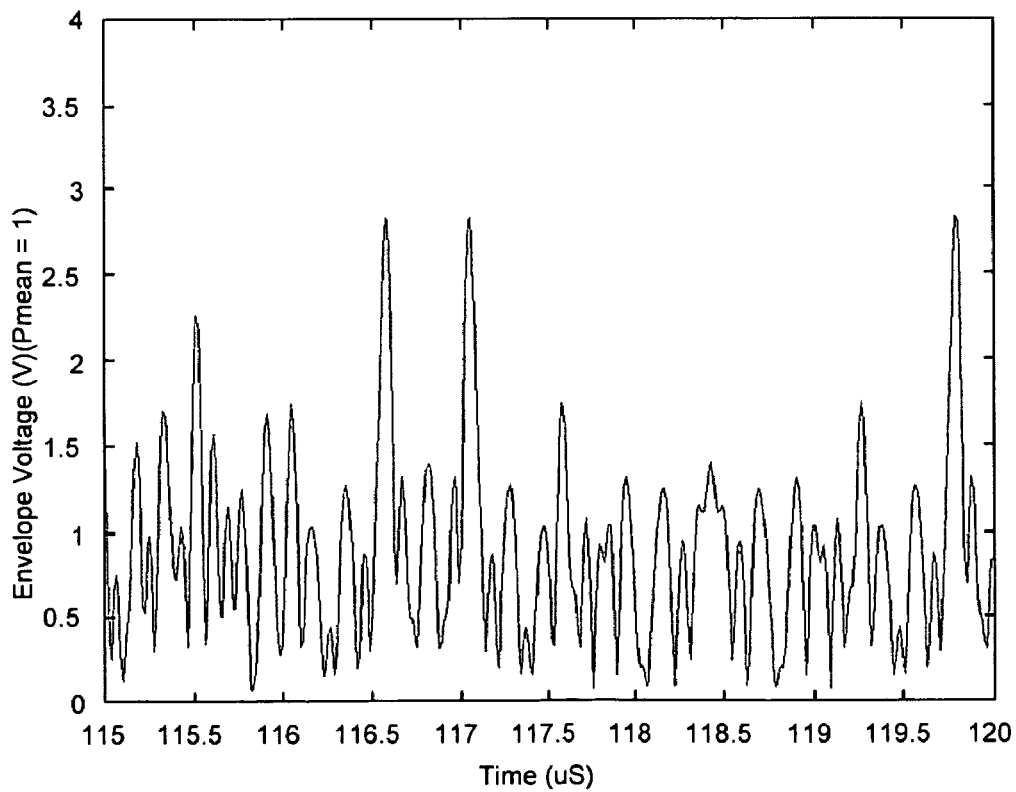
FIG. 2 illustrates a graphical representation depicting envelope voltage versus time of a peak pulse.

Referring to FIG. 2, a graphical representation of peak pulse 21 is shown. The peak pulses 21 are infrequent and of limited duration 22.

Figure 3:
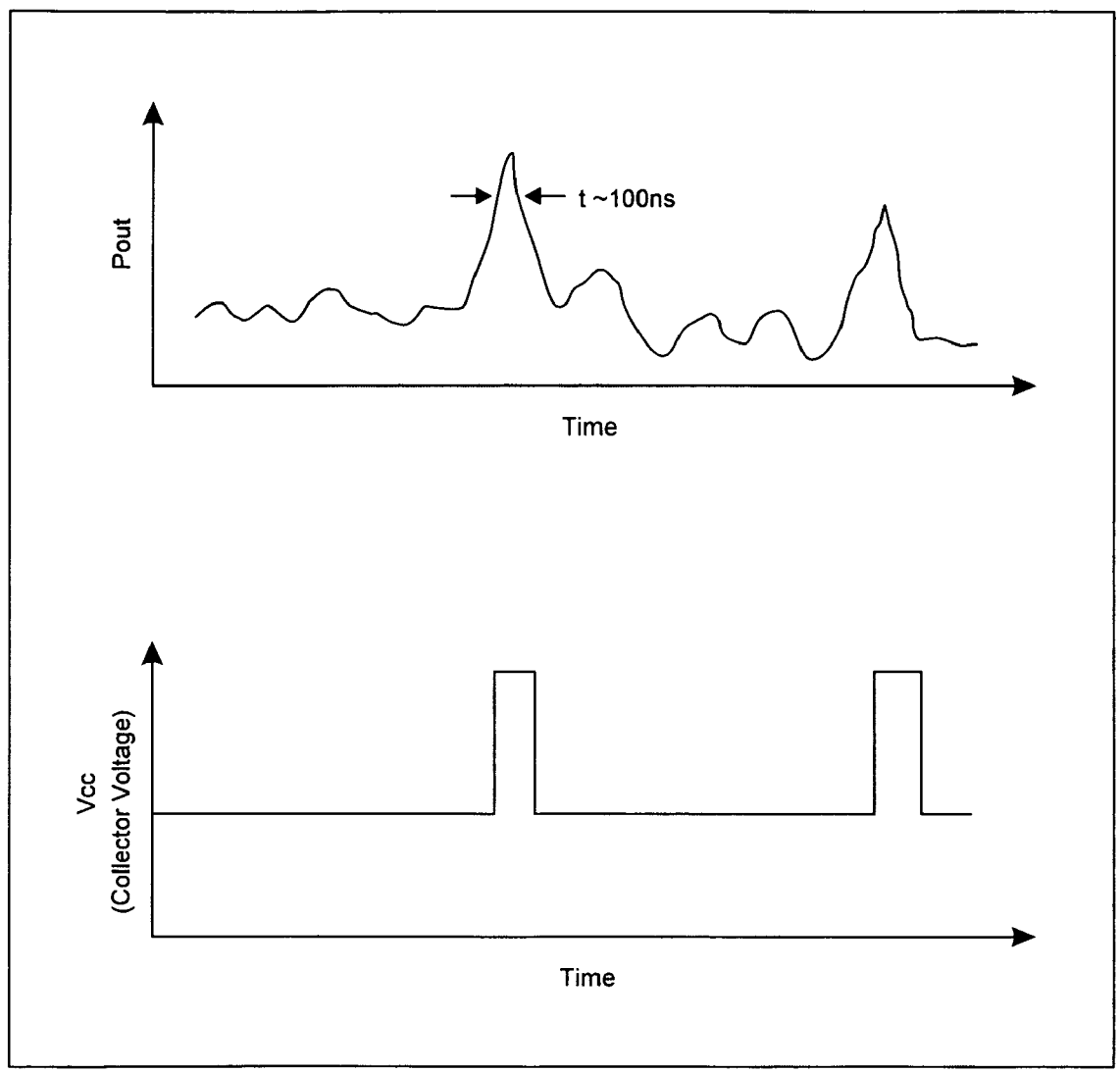
FIG. 3 illustrates a boost in collector voltage where the collector voltage of the PA is boosted for supporting peak pulses.

To extend the prior art class B amplifier operation according to the invention, the collector voltage of the PA is boosted for supporting peak pulses. Referring to FIG. 3, a graphical representation of a boost in collector voltage is shown. Comparing FIG. 3 to FIG. 2, it is evident that the boost 31 in collector voltage is sufficient to support the peak pulses 21, both in time and in duration. Boosting the collector voltage increases a range of Pout supported by the PA while the collector voltage is boosted and without increasing transistor size. Since operation of the PA is unaffected, the remainder of the amplifier specifications—minimum current, etc.—need not be modified. Further, when the boosted voltage on the collector is generated in an efficient fashion, the power added efficiency of the PA is increased.

Figure 4A:
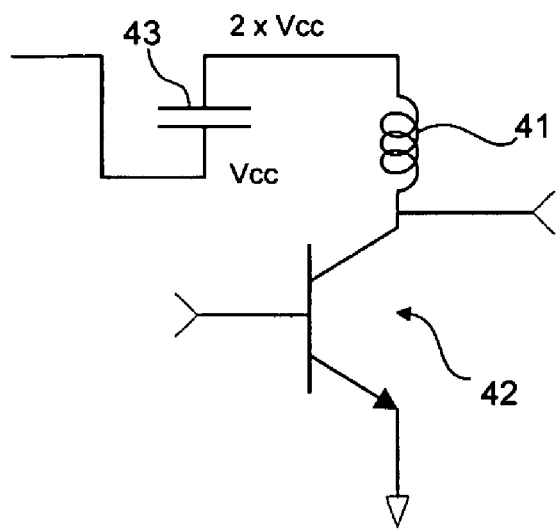
FIG. 4 illustrates a simplified voltage multiplier circuit in a first mode of operation.
Figure 4B:
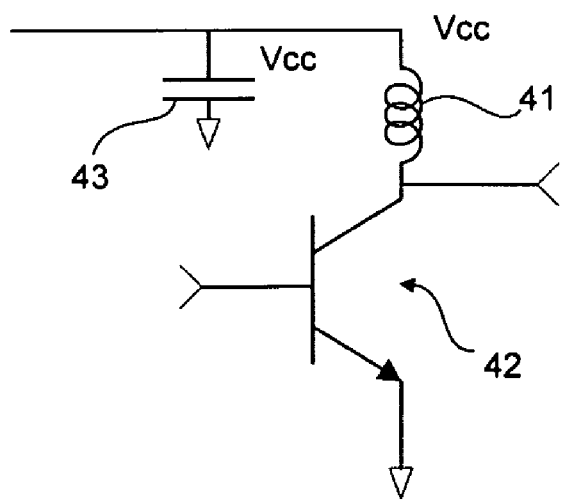

Referring to FIG. 4, a simplified voltage multiplier circuit is shown in a first mode of operation shown at (a) wherein a first voltage level is provided to a collector 41 of a transistor 42 within a PA (not completely shown). A capacitor 43 is shown for being charged by a power source in this mode of operation. In a second mode of operation shown at (b), a same simplified circuit is shown wherein the capacitor 43 is employed for boosting the collector voltage applied to the collector 41 within the PA (not completely shown). For example, using capacitors and FET switches additional voltage is switched from the capacitors to the collector to support the peak pulses and provide for peak output powers. A fairly narrow implementation is to use a 3.3 V supply and a 1.8 V supply on a WLAN circuit to switch the supply from 3.3 V to 5.1 V wherein the 3.3 V supply is disposed in series with a capacitor charged to 1.8 V providing a 1.9 dBm increase in output power.

The size of the capacitor 43 is preferably relatively small as the duration of the required pulse is typically short. For example a 250 nF capacitor would source a 500 mA current to within 0.2V for a duration of 100 nsec, ignoring resistive losses. Thus, a physically small and inexpensive voltage doubler or other known voltage increasing circuit is implemented.

Figure 5:
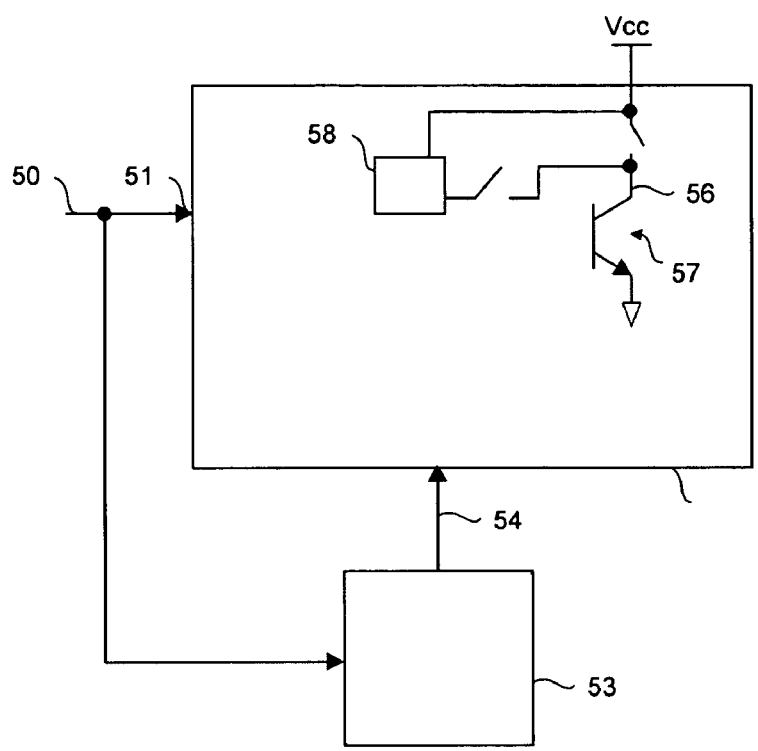
FIG. 5 illustrates a simplified block diagram of a circuit according to the invention.

Referring to FIG. 5, a simplified block diagram of a circuit according to the invention is shown. An RF signal 50 is received at an input port 51 of a PA block 52. The RF signal 50 is also provided to a sensing circuit 53 to identify peak pulses therein. In response to a detected peak pulse, the sensing circuit 53 provides a peak pulse signal 54 to the PA block 52. Also provided to the PA block 52 is a biasing voltage 55 for biasing of the collector 56 of an amplifying transistor 57 within the PA block 52. The PA block stores the received voltage in a voltage storage element 58 and, in response to the peak pulse signal adjusts the bias voltage at the collector to support peak pulse operation. Optionally, a voltage doubler circuit as described above with reference to FIG. 4 is used to double the bias voltage applied to the collector when necessary.

Figure 6A:
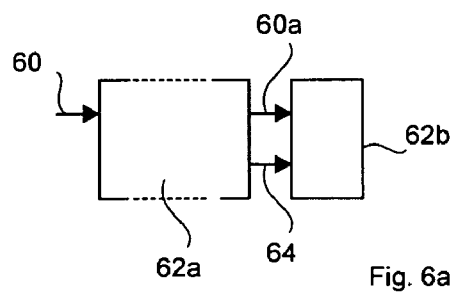
FIG. 6a illustrates a simplified block diagram of a circuit for sensing of the OFDM RF signal amplitude.

Referring to FIG. 6a, a simplified block diagram of a circuit for sensing of the OFDM RF signal amplitude is shown. Here sensing of collector current on one of the earlier amplifier stages 62a, for example using the self-bias effect, provides an indication that a large peak is being provided to a later stage 62b of the amplifier. The RF signal 60 is received by the earlier stage amplifiers 62a and pre-amplified to produce a pre-amplified RF signal 60a. The self bias effect on a pre-amplification stage momentarily increases collector current on a transistor within that stage. By feeding forward the increased current to switch the switches to increase the voltage on the collector of the amplifying transistor an indicator signal 64 is generated in response to the sensed current.

Figure 6B:
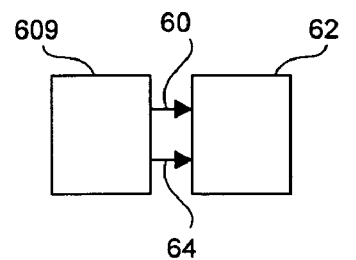
FIG. 6b illustrates a simplified block diagram of a circuit for determining of the OFDM RF signal amplitude.

Referring to FIG. 6b, a simplified block diagram of a circuit for determining of the OFDM RF signal amplitude is shown. Here, during OFDM modulation, modulator 609 provides an indicator signal 64 corresponding to peak pulses within the OFDM modulated signal 60. Both the indicator signal 64 and the modulated RF signal 60 are provided to the amplifier 62. The indicator signal 64 is timed in a known fashion relative to the modulated signal 60 such that the amplifier in response to the indicator signal has time to switch the voltage on the amplifying transistor collector.

Figure 6C:
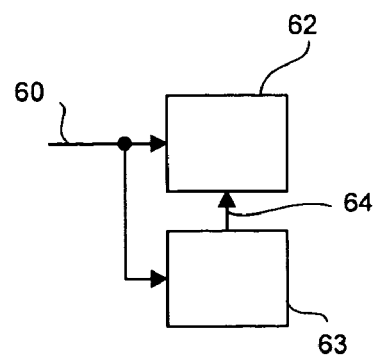
FIG. 6c illustrates a simplified block diagram of a circuit for sensing the OFDM RF signal amplitude.

Referring to FIG. 6c, a simplified block diagram of a circuit for sensing of the OFDM RF signal amplitude is shown. Here sensing of the incoming OFDM RF signal 60 by amplitude sensor 63 is employed for sensing the RF power within the OFDM RF signal 60. An indicator signal 64 is generated in response to the sensing of the OFDM RF signal 60. Both the OFDM RF signal 60 and the indicator signal 64 are provided to the RF amplifier 62.

Figure 7:
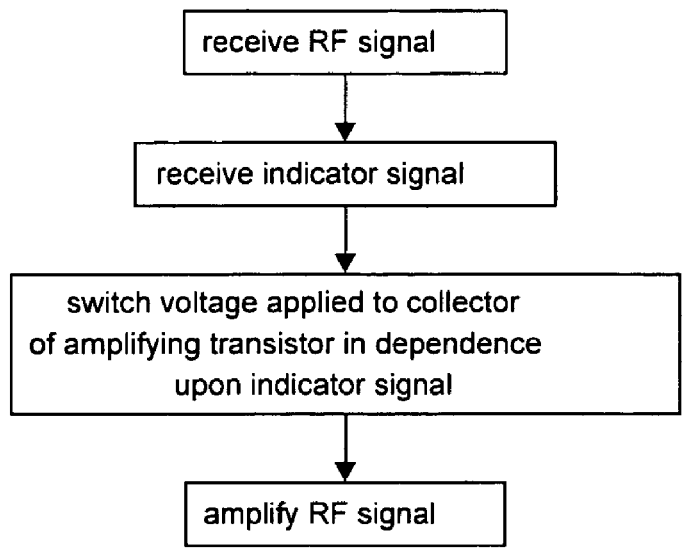
FIG. 7 shows a simplified flow diagram of a method for supporting OFDM peak pulses.

Referring to FIG. 7, a simplified flow diagram of a method for supporting OFDM peak pulses is shown. An RF signal is received. An indicator signal is provided indicative of an amplitude of the RF signal. In dependence upon the indicator signal, a collector voltage of an amplifying transistor is switched to one of a first voltage and a second higher voltage. The RF signal is amplified by the amplifier in dependence upon the collector voltage applied to the amplifying transistor.

The indicator signal is generated in accordance with one of the block diagrams of FIGS. 6a through 6c or through another method or circuit.

Figure 8:
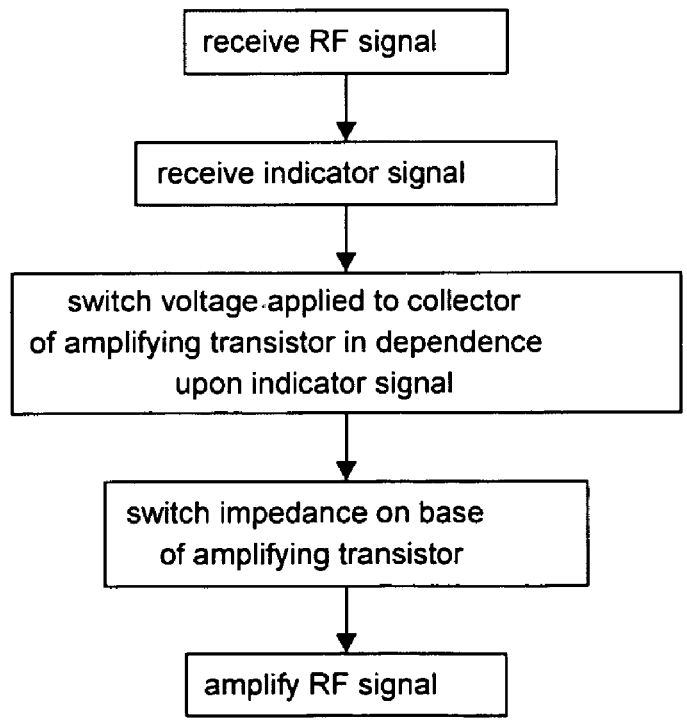
FIG. 8 shows a simplified flow diagram of an alternative method for supporting OFDM peak pulses wherein avalanche conditions are avoided.

Referring to FIG. 8, a simplified flow diagram of an alternative method for supporting OFDM peak pulses is shown. The flow diagram is similar to the flow diagram of FIG. 7 except that here, when the voltage is increased on the collector, an impedance on the base of the amplifying transistor is reduced to prevent a possibility of avalanche in said amplifier. Thus, the reduced impedance allows for a bleed off of the excessive electron hole pairs resulting from the instantaneous increase in collector voltage.

Figure 9:
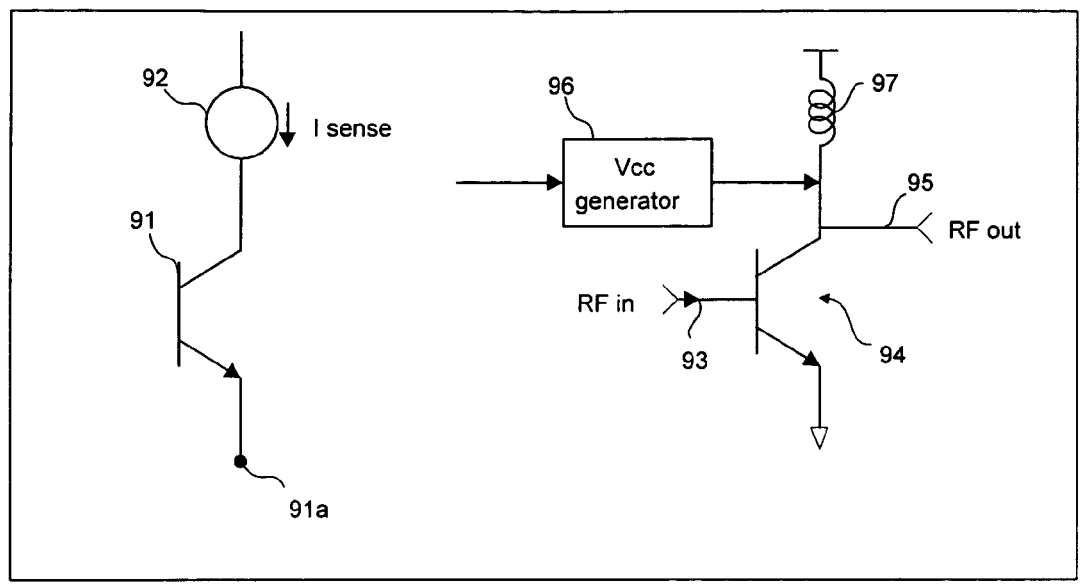
FIG. 9 shows a simplified circuit diagram of a circuit according to the invention.

Referring to FIG. 9, a circuit diagram is shown of an embodiment of the present invention. Another amplifying transistor 91 of a stage other than the stage to which the invention is applied is used to monitor the RF signal amplitude. Here, the collector current rises when the amplitude is increased and, as such, a current sensor 92 is used to detect signal amplitude. The sensed signal is then provided to the voltage switching circuit 96 for switching of voltage levels applied at the collector of the amplifying transistor 94. The amplified RF signal is provided at RF output port 95. This circuit optionally uses a current mirroring device to prevent excessive current within the detector circuit. Preferably, this circuit is wideband and supports high frequency operation. An alternative circuit provides an indicator signal from a data modulation circuit, in the form of a MODEM, to activate the voltage doubling circuit.

Typically, any boost in voltage at the collector of the amplifying capacitor is for a fixed duration of time such that the effects of the voltage boost are known during circuit design and are therefore predictable. Alternatively, the sensing circuit is used to provide a signal to actuate turning off the collector voltage boost. This allows for the boost to be for a shortest acceptable time saving a step of determining and setting an accurate time constant. Preferably, a same indicator signal is used for activating the voltage boost and for deactivating thereof.

Figure 10:
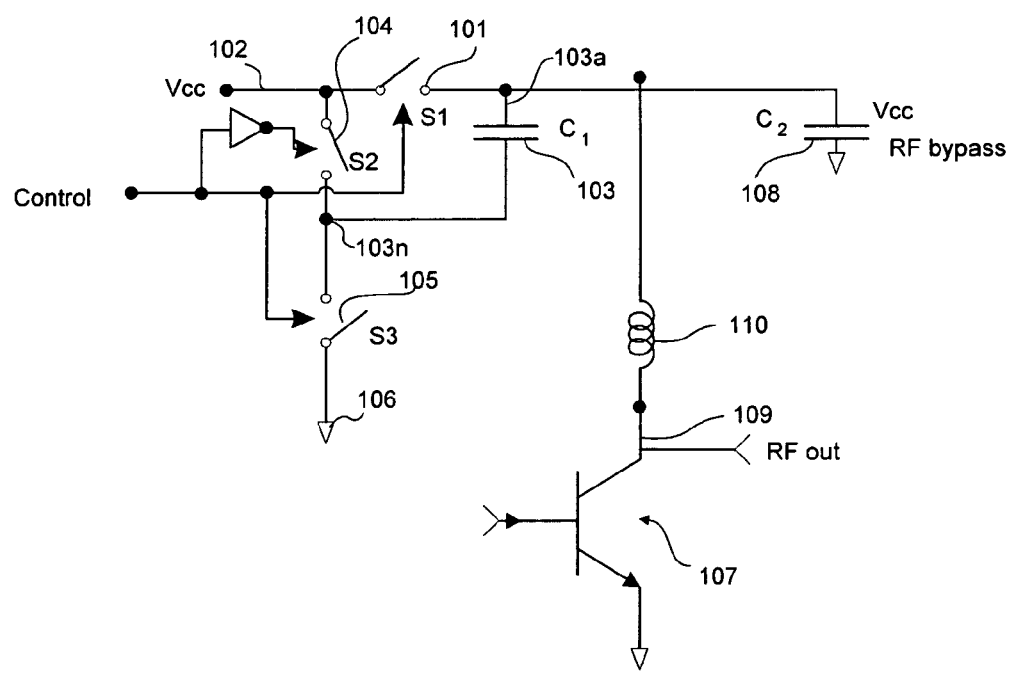
FIG. 10 shows another circuit according to the invention.

Referring to FIG. 10, an improved circuit for carrying out the invention is shown. Here, the switch for switching of the voltage on the amplifying transistor collector comprises a first switch 101 coupled between the voltage source 102 and a first terminal 103a of capacitor 103; a second switch 104 coupled between the voltage source 102 and a second other terminal 103b of the capacitor 103; and a third switch 105 coupled between the second other terminal 103b and ground terminal 106. A second capacitor 108 is also provided for being charged by the voltage source. During operation, the second switch 104 and the third switch 105 cannot be closed simultaneously as this would short the power supply rails. An inductor 110 is coupled between the first switch 101 and the collector 109. As such, there is a switching period during which the collector 109 of the amplifying transistor 107 is not driven. During this period of time, the second capacitor 108 maintains the voltage on the collector 109. This results in a stable switching process.

Figure 11:
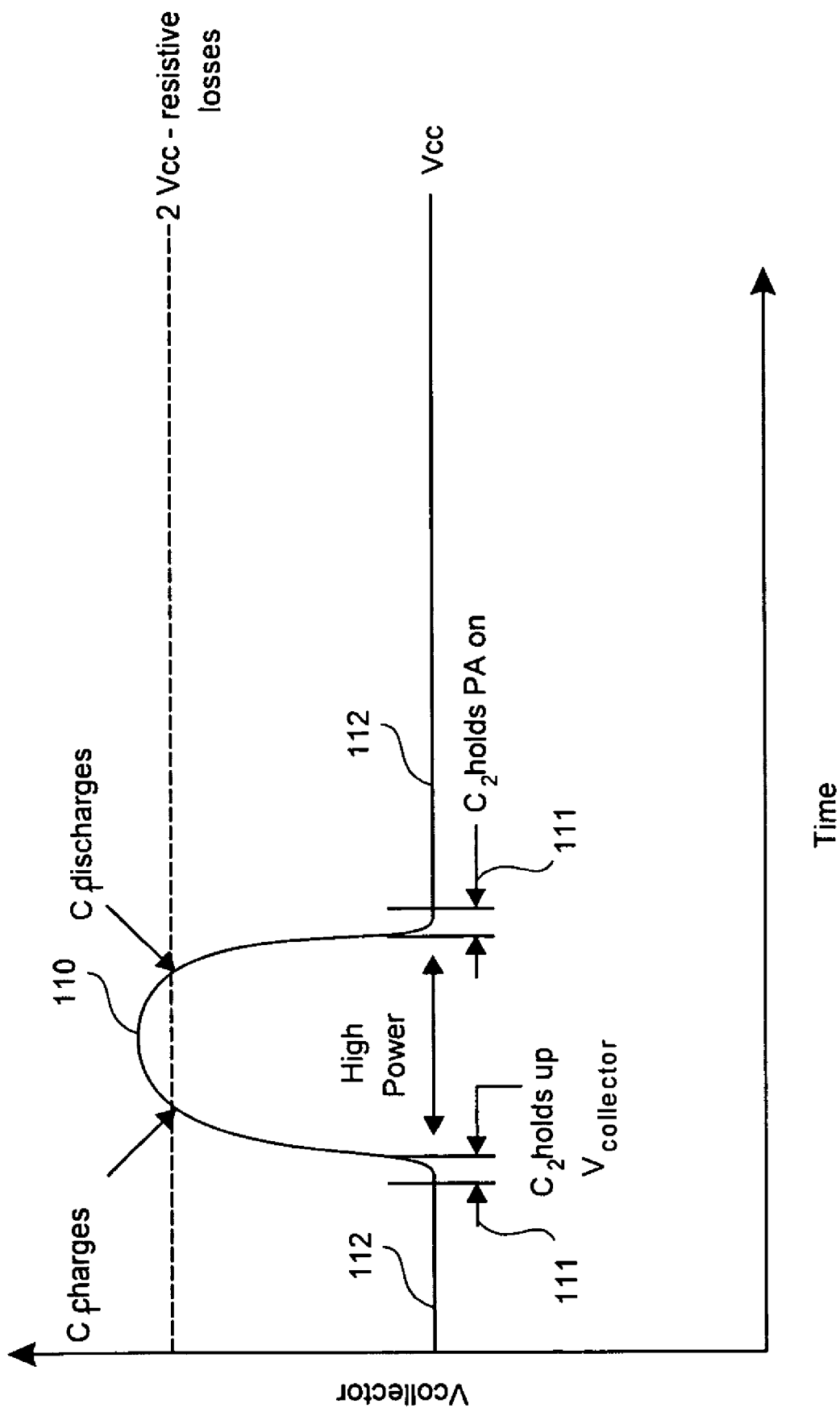
FIG. 11 shows a graphical representation of the voltage at the collector of an amplifying transistor during each of the two modes of operation thereof and during the switching periods therebetween.

Referring to FIG. 11, a graphical representation of voltages during the switching process is shown. Here, the second capacitor 108 maintains the voltage on the collector 109 during the switch intervals 111. During the second mode of operation, when the capacitor and voltage source are in series, 110 the voltage rises steeply and then discharges slowly. In the first mode of operation 112, the voltage is held relatively constant by the power source.

The present invention increases the voltage on an amplifying transistor of a stage of a power amplifier for a brief interval, for example at a collector thereof. The increased collector voltage provides higher peak power during a peak pulse in the incoming OFDM signal. The collector is biased with a lower collector voltage than normal and this technique is used to respond to peaks in the OFDM signal. The lower collector voltage that is quiescent allows a reduction in power consumption. Alternatively, when normal bias voltage is applied, reduced distortion advantageously results with the present method. Clearly for both cases, in order to properly provide an undistorted output signal, the collector voltage must be increased at the correct time without delay relative to the RF signal and for at least the correct duration. The increase in the collector voltage during the period of the peak pulse allows an amplified signal with less distortion than that provided with the normal collector voltage.

Alternatively, more than one capacitor is used to boost the collector voltage of the amplifying transistor. As such, two embodiments are supported. In a first further embodiment, the plurality of capacitors are each used independently to boost the voltage on the collector of the amplifying transistor such that the circuit supports a multiplicity of peak pulses in close temporal proximity one to another. In another embodiment, each capacitor is switchable for allowing a variety of voltage boost levels on the collector of the amplifying transistor. Further, a combination of the two further embodiments is possible wherein capacitors are switchable independently for aggregation or for separate boosting of voltage levels. For example, the PA when run off a low voltage, e.g. 1.8V is boostable to 2×, 3× or 4× the 1.8V using this technique.

Alternatively, FET transistors are used in place of the BJT transistors described hereinabove. When FET transistors are used, it will be appreciated that the source of the transistor is a suitable analogue to the collector of a BJT.

Advantageously, the present invention as described supports complete integration allowing for low cost implementation thereof.

Numerous other embodiments may be envisioned without departing from the spirit or scope of the invention.

What is claimed is:

1. An amplifier comprising:
   an amplifying transistor having one of a base, an emitter and a collector and a gate, a source, and a drain;
   a first capacitor;
   a voltage source for providing one of the collector and the source with a first voltage and for in a first mode of operation charging the first capacitor; and,
   a switch for switching between the first mode of operation and a second other mode of operation wherein the first capacitor and the voltage source cooperate to provide a voltage at the one of the collector and the source in excess of the first voltage.

2. An amplifier according to claim 1, comprising:
   an RF signal input port for receiving an RF signal and coupled with the amplifying transistor for amplifying of said received RF signal;

a sensing circuit for sensing an amplitude of the RF signal and for providing an indicator signal in dependence thereon; and, an indicator signal input port for receiving the indicator signal.

3. An amplifier according to claim 2, comprising:

a second capacitor;

wherein the voltage source is for in the first mode of operation charging the second capacitor and wherein the second capacitor acts to maintain a voltage at one of the collector and the source during switching of the switch.

4. An amplifier according to claim 1 wherein the first capacitor comprises a first terminal and a second other terminal, and wherein the switch comprises a first switch coupled between the voltage source and the first terminal; a second switch coupled between the voltage source and the second other terminal; and a third switch coupled between the second other terminal and ground.

5. An amplifier according to claim 4 wherein the second switch and the third switch are other than open simultaneously.

6. An amplifier according to claim 2 wherein the indicator signal is a collector current of another amplifying transistor of an amplifier stage previous to the amplifier stage of the amplifying transistor.

7. An amplifier according to claim 2 wherein the indicator signal is a source current of another amplifying transistor of an amplifier stage previous to the amplifier stage of the amplifying transistor.

8. An amplifier according to claim 2 wherein the sensing circuit comprises circuitry for sensing an amplitude of the RF signal.

9. An amplifier according to claim 2 wherein the RF signal is an OFDM RF signal.

10. An amplifier according to claim 2 wherein the voltage source consists of a single voltage rail at Vcc.

11. An amplifier according to claim 1 wherein the voltage source consists of two voltage rails and wherein the switching circuit is for providing one of the voltages or a combination of the two voltages wherein the combination of the two voltages is the boost voltage.

12. An amplifier according to claim 1 wherein the switching circuit consists of only FETs, capacitors, and resistors.

13. An amplifier according to claim 1 wherein the switching circuit consists of only BJTs, capacitors, and resistors.

14. An amplifier according to claim 1 integrated onto a same substrate.

15. An amplifier according to claim 2 absent RF circuitry for sensing the RF signal.

16. An amplifier according to claim 3 comprising a resistor having a resistance and disposed in series with the first capacitor, the resistance selected for controlling the voltage rise time on the one of the collector and the source.

17. An amplifier according to claim 2 wherein the indicator signal is based on a base current of another amplifying transistor of an amplifier stage previous to the amplifier stage of the amplifying transistor.

18. An amplifier according to claim 1 wherein the one of a base, an emitter and a collector and a gate, a source, and a drain comprises a base, an emitter, and a collector.

19. An amplifier according to claim 1 wherein the one of a base, an emitter and a collector and a gate, a source, and a drain comprises a gate, a source, and a drain.

20. A storage medium having stored therein data, the data for when executed resulting in an amplifier design comprising:

an amplifying transistor having a first port, a second port and a third port;

a first capacitor;

a voltage source for providing the third port with a first voltage and for in a first mode of operation charging the first capacitor; and, a switch for switching between the first mode of operation and a second other mode of operation wherein the first capacitor and the voltage source cooperate to provide a voltage at the third port in excess of the first voltage.

21. A method of amplifying an OFDM RF signal comprising:

providing a first voltage source;

providing a second voltage source;

providing an OFDM RF signal including peak pulses;

providing an indication of a presence of a peak pulse; and during a duration of the indicated peak pulse, boosting the voltage on the amplifier by summing a voltage of the first voltage source and a voltage of the second voltage source and applying said sum thereto, wherein the second voltage source is a capacitor, the capacitor charged by the first voltage source.

* * * * *